United States Patent [19]

Sayah et al.

[11] Patent Number: 5,533,148
[45] Date of Patent: Jul. 2, 1996

[54] METHOD FOR RESTRUCTURING PHYSICAL DESIGN IMAGES INTO HIERARCHICAL DATA MODELS

[75] Inventors: John Y. Sayah, Fishkill; Robert A. Rozwod, Hopewell Junction, both of N.Y.

[73] Assignee: International Business Machines Corporation, Armonk, N.Y.

[21] Appl. No.: 129,926

[22] Filed: Sep. 30, 1993

[51] Int. Cl.$^6$ ............................................. G06K 9/36
[52] U.S. Cl. ..................... 382/240; 382/243; 364/491
[58] Field of Search .............................. 364/488, 489, 364/490, 491; 382/143, 144, 145, 147, 240, 243, 305, 176

[56] References Cited

U.S. PATENT DOCUMENTS

| | | | |
|---|---|---|---|
| 4,484,292 | 11/1984 | Hong et al. | 364/491 |
| 4,612,618 | 9/1986 | Pryor et al. | 364/490 |
| 4,688,072 | 8/1987 | Heath et al. | 357/45 |
| 4,785,391 | 11/1988 | Apley et al. | 364/518 |
| 4,829,446 | 5/1989 | Draney | 364/488 |
| 4,831,543 | 5/1989 | Mastellone | 364/489 |
| 4,890,238 | 12/1989 | Klein et al. | 364/491 |
| 4,910,690 | 3/1990 | Hiwatashi | 364/491 |
| 4,918,614 | 4/1990 | Modarres et al. | 364/490 |
| 4,944,023 | 7/1990 | Imao et al. | 382/240 |
| 5,280,547 | 1/1994 | Mahoney | 382/4 C |
| 5,341,309 | 8/1994 | Kawata | 364/488 |
| 5,381,343 | 1/1995 | Bamji et al. | 364/488 |

FOREIGN PATENT DOCUMENTS 178775  11/1990  Japan ....................... G06F 15/60

OTHER PUBLICATIONS

A. Kalvin, S. Peleg, and R. Hummel., "Pyramid Segmentation in 2-d and 3-d Images Using Local Optimization", Proceedings of the 9th International Conference on Pattern Recognition, pp. 276-278, Nov. 1988.

A. Montanvert, P. Meer, and A. Rosenfeld., "Hierarchical Image Analysis Using Irregular Tessellations", IEEE Transactions on Pattern Analysis and Machine Intelligence, vol. 13, No. 4, pp. 307-316, Apr. 1991.

C. A. Sher and A. Rosenfeld., "Detecting and Extracting Compact Textured Regions Using Pyramids", Image Vision Computing vol. 7, No. 2, pp. 129-134, May 1989.

R. Nair, V. Chickermane and R. Chamberlain., "Restructuring VLSI Layout Representations for Efficiency", IBM Research Report, RC 16103 (#71504), Sep. 1990.

*Primary Examiner*—Leo Boudreau
*Assistant Examiner*—David R. Anderson
*Attorney, Agent, or Firm*—Peter W. Peterson; DeLio & Peterson; Aziz M. Ahsan

[57] ABSTRACT

A method for restructuring information stored in physical design image form, such as an image of a layer in a semiconductor package, into a hierarchical area specification model useful in automated design applications. The restructuring results in recognizing identical patterns in the image and storing common information about the patterns in a single location to decrease storage space required and improve access efficiency by design application programs needing the information. Parameters controlling the method can be adjusted to produce a hierarchical model that is particularly suited to the needs of a particular application program.

17 Claims, 12 Drawing Sheets

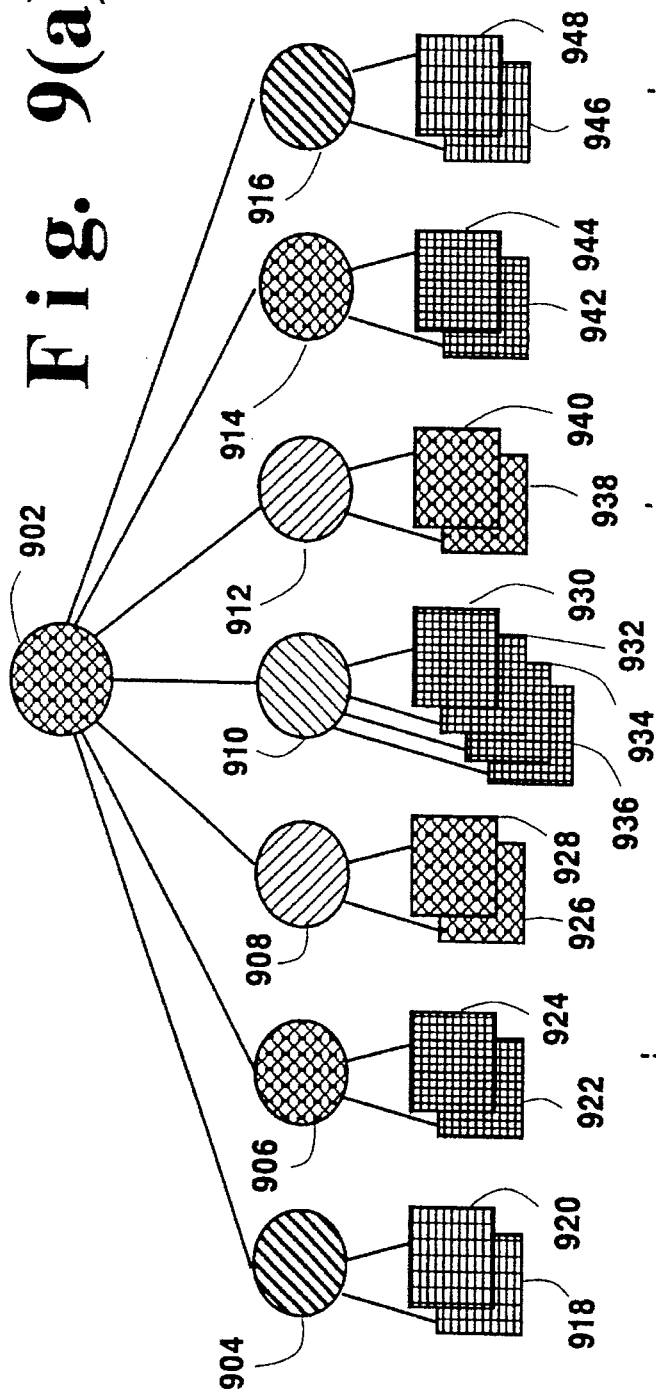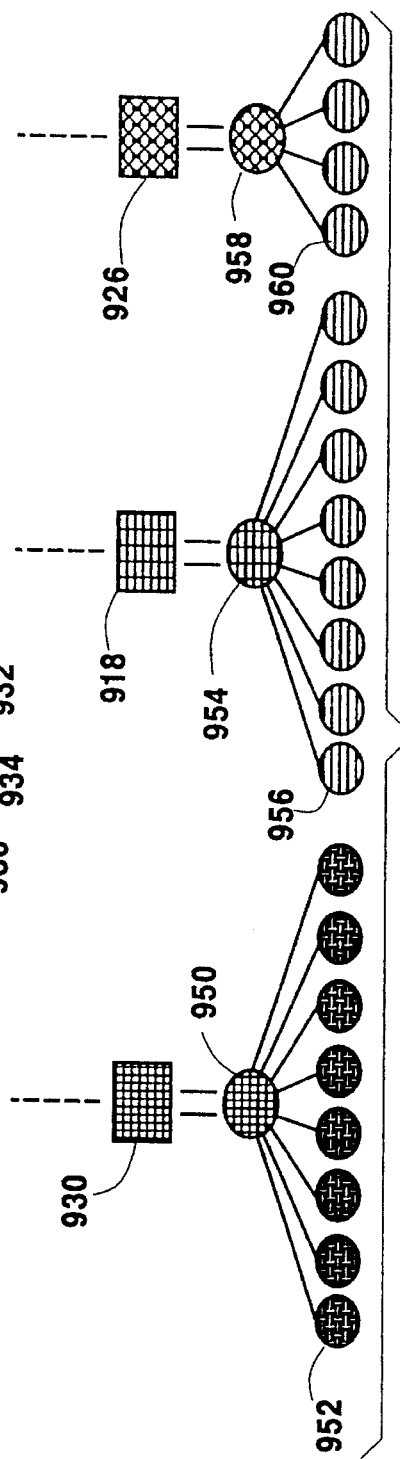

METHOD FOR RESTRUCTURING PHYSICAL DESIGN IMAGES INTO HIERARCHICAL DATA MODELS

BACKGROUND OF THE INVENTION

1. Field of the Invention

This invention generally relates to methods of organizing information, particularly information related to semiconductor integrated circuit layouts, for use by computer programs that do automated design. More specifically, the invention relates to a method of restructuring and reorganizing information previously stored in bitmap or flat file physical design image form into a hierarchical data model form which provides more efficient storage and faster access to the data.

2. Description of Related Art

Computer assisted design (CAD) is generally well-known and relatively well-developed for a variety of applications, including general drafting, architectural, and other applications. CAD techniques are particularly suited for the design of mask or pattern layouts of integrated circuits due to the highly repetitive nature of such designs.

A particular type of CAD application is an automated design program. Such programs automatically select possible designs, preferably optimized designs, to meet the many critical design constraints which must be observed during the design process. Particularly in the integrated circuit design field, they are essential in producing reliable designs in a timely and cost-effective manner. Because of their wide use in the integrated circuit design field, this invention is described with particular emphasis on that field, although the invention finds application in other fields of design as well.

All automated design programs need to consider the physical characteristics of the object being designed. For example, in the design of a semiconductor device there may be one program to perform placement of semiconductor devices and another program to perform wiring between the devices. The placement application requires information as to target placement area, constraints on the placement area and legality information as to what placeable objects can be placed in what areas. The wiring program needs to understand location information such as pin and via locations, spacing constraints, and characteristics such as coupling coefficients.

The information that each automated design tool needs to perform its job is called "image" information. Different images are required for different applications, e.g. placement and wiring. To facilitate processing of the information, it is important that the images be represented compactly and in a form that is relatively easy to access.

Current design automation tools usually represent these images in flat bitmap type structures. In this type of representation, each coordinate or point of interest in a semiconductor package being designed is represented by a group of bits. Each group of bits contains information relating to the point to which the group corresponds. Each layer in the package is represented by a two-dimensional array of such groups of bits. To use the image, the design tool must process the data stored in the bit groups that correspond to the points within the area of interest.

This flat bitmap image structure does not provide the critical information in a form which is quick to process and easy to access. Nor does it meet the goal of efficient and compact storage. In particular, semiconductor devices are typically formed of repeated patterns, or patterns which are substantially repeated but modified to a greater or lesser extent in particular iterations of the pattern. In the usual bitmap form, the information about each of the repeated patterns is repeated for every iteration of the pattern. The processing and handling of the large amount of data coupled with the design rules which must be satisfied, impose severe time penalties on the computer processing and slow the automated design process unacceptably.

To alleviate this problem and improve the efficiency of data access it is known to select different types of data structures which may be better suited for the desired task. For example, it is recognized in the data processing arts that operation of an application program can often be enhanced by the data structure employed to hold data upon which the application program will operate. When a search of data is required, tree structures will increase search speed since, if properly managed and rebalanced from time to time, a tree structure will permit a portion of the data remaining to be searched to be ignored subsequent to each search path decision.

However, during computer assisted design of integrated circuits, in particular, the amount of data which is generated and the number of operations to be performed thereon is sufficient to significantly slow the response time of the data processing apparatus even if such known data structures are optimally used. This is because the management of the data structure itself requires a significant amount of computation overhead. Further, no single data structure is optimum for all applications or even all parts of a single application.

Of course, techniques are known for manipulating data structures such as for rebalancing of tree structures and rearranging data in one data structure into another data structure. That is, flat (e.g. all image points represented without regard to relative position), segmented or slotted (e.g. where restrictions are placed on locations of sub-patterns) and the like can be freely translated to other data structures such as tree structure within the present state of the art, but only at the cost of substantial computing overhead. Running such translation programs in the foreground, or even under general control of the design program does not engender efficiency, when a large amount of data is involved.

A substantial loss of efficiency accrues as increasing amounts of data are generated during the design process, particularly in the case of integrated circuit design. This can be appreciated by observing that the benefit of tree structures is that they allow substantial amounts of data to be ignored during the search of that data. Manipulating each piece of data in the database, or even a significant fraction thereof, to allow an efficient search, clearly would require more data processing time then is saved by an optimally efficient search.

One data structure that has been used in integrated circuit design applications is a hierarchical quad tree model. In this model, each area of the bitmap image is divided up into pieces by quadsection, i.e., by repeatedly splitting each area into four equal pieces, until the entire image area is divided down to the desired granularity.

The result of the repeated splitting is to provide an area tree. The topmost node of the tree corresponds to the entire image. The next level contains four nodes, corresponding to four equal quadrants of the image. The next level contains sixteen nodes, four connected to each of the four quadrant nodes at the level above, and each corresponding to one fourth of the area of its quadrant, i.e., one sixteenth of the entire area. The splitting of each sub-area into four pieces continues until the final smallest areas are reached at the desired granularity level.

While this hierarchical area organization can improve data handling when coupled with appropriately designed automation tools, its rigidly fixed quad structure introduces many inefficiencies. Principally, the quad tree hierarchical arrangement and other hierarchical models which use fixed structures, fail to consider the characteristics of different regions in the dividing process, and fail to identify repeated patterns that do not match the fixed structure, thereby losing storage efficiency as compared to an optimized model that stores common information about repeated patterns in a single shared location.

A related problem with fixed structure models is in the failure to provide rapid access to the information for all access patterns. The fixed structure model tends to require longer searches for information than would be needed if the model considered the underlying physical characteristics and layout of the package in a form that is specialized for a type of application. The constraints imposed by the data structure and the modeling of the physical structure being designed, are a major impediment to the operational efficiency of computer assisted design applications.

Accordingly, there is a long felt need for transforming physical image data into a form which provides efficient access to data during computer assisted design processing. Meeting this need is one object of the present invention.

Another object of the present invention is to provide a method of hierarchically organizing data in an image which relates to the technology underlying the circuit elements or components of the image. This corresponds the model more closely to the physical reality and permits use of the model at an earlier design stage when the technology is being selected to meet the requirements of the device being designed.

Yet another object of the present invention is to provide a method for restructuring physical design images into hierarchical data models which allows different restructuring criteria to be used to optimize the hierarchical model for use by different application programs.

Yet another object of the invention is to provide a method of generating a hierarchical data model from a physical design image which hides the details of the areas being represented at lower layers from design application programs which do not need to access those details.

A further object of the invention is to provide for data sharing to reduce the total amount of data stored by providing constructs which reuse information that is common between different entities.

SUMMARY OF THE INVENTION

The above and other objects, which will be apparent to those skilled in the art, are achieved in the present invention which is directed to a method for restructuring an image into a data model. The restructuring results in recognizing identical patterns in the image and storing common information about the patterns in a single location to decrease storage space required and improve access efficiency by design application programs needing the information. Parameters controlling the method can be adjusted to produce a hierarchical model that is particularly suited to the needs of a particular application program.

The method includes the steps of providing an image, identifying leaf areas in the image, classifying the leaf areas as being of one or more types according to a characteristic of the leaf areas, grouping adjacent leaf areas of equivalent type into one or more area arrays, recognizing equivalent area arrays and forming a set of one or more unique area arrays, partitioning each unique area array into one or more partition areas, recognizing equivalent partition areas and forming a set of one or more unique partition areas, and generating area specifications for the entire image area, for each unique partition area and for each unique leaf area.

In one embodiment of the invention, the step of grouping adjacent leaf areas into area arrays includes the steps of scanning the image in a first direction, grouping leaf areas of equivalent type that are adjacent in the first direction to form one dimensional area arrays, scanning the image in a second direction, and grouping equivalent one dimensional area arrays that are adjacent in the second direction to form the area arrays.

In the preferred embodiment, the step of partitioning comprises recursively partitioning each unique area array according to desired partitioning criteria to form a hierarchical array of one or more partition areas. Post-processing grouping is optionally performed according to a top level grouping algorithm to reduce the number of children areas at the top level of the area tree and its corresponding hierarchical area specification structure.

BRIEF DESCRIPTION OF THE DRAWINGS

For a fuller understanding of the invention, reference should be made to the following description taken in connection with the accompanying drawings, in which:

FIGS. 7–11 illustrate the steps of the present invention in connection with a third sample physical design image.

FIG. 7 graphically illustrates the steps of grouping leaf areas into area arrays and identifying the unique area arrays.

FIGS. 9(a) and 9(b) illustrate the hierarchical area tree, in a collapsed format, of the physical design image in FIG. 7.

FIG. 10 illustrates the top half of the hierarchical area tree corresponding to FIG. 9(a) after post processing grouping has added additional higher level areas.

DESCRIPTION OF THE PREFERRED EMBODIMENT

Figure 1:
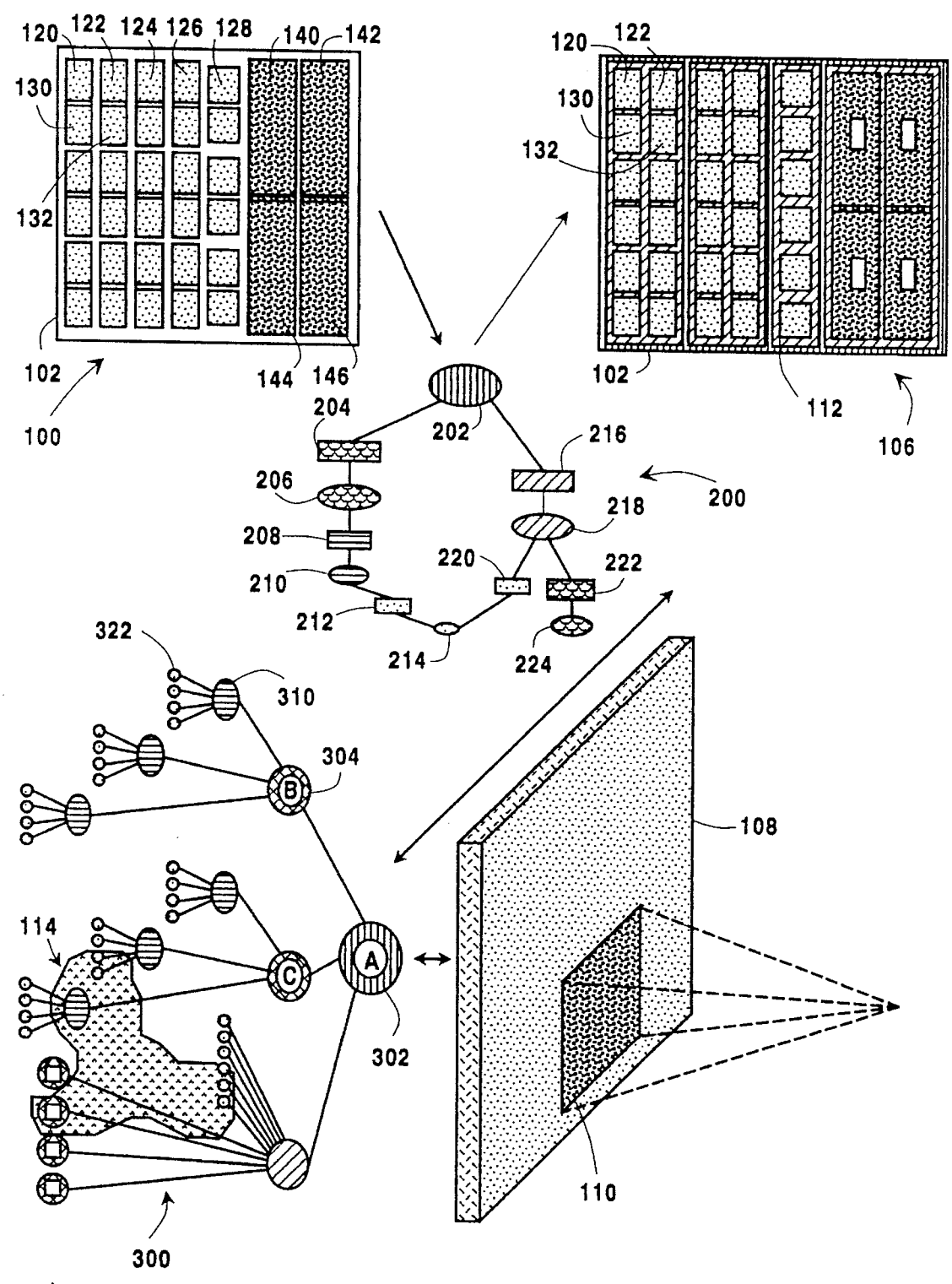
FIG. 1 illustrates a graphical overview of the starting point (a sample physical design image) and the endpoint (a corresponding hierarchical data model) of the present invention, along with representations of how the hierarchical model produced by the method of the invention may be used, including a hierarchically restructured image, a hierarchical area tree and a representation of access thereto by a design application.
Figure 2:
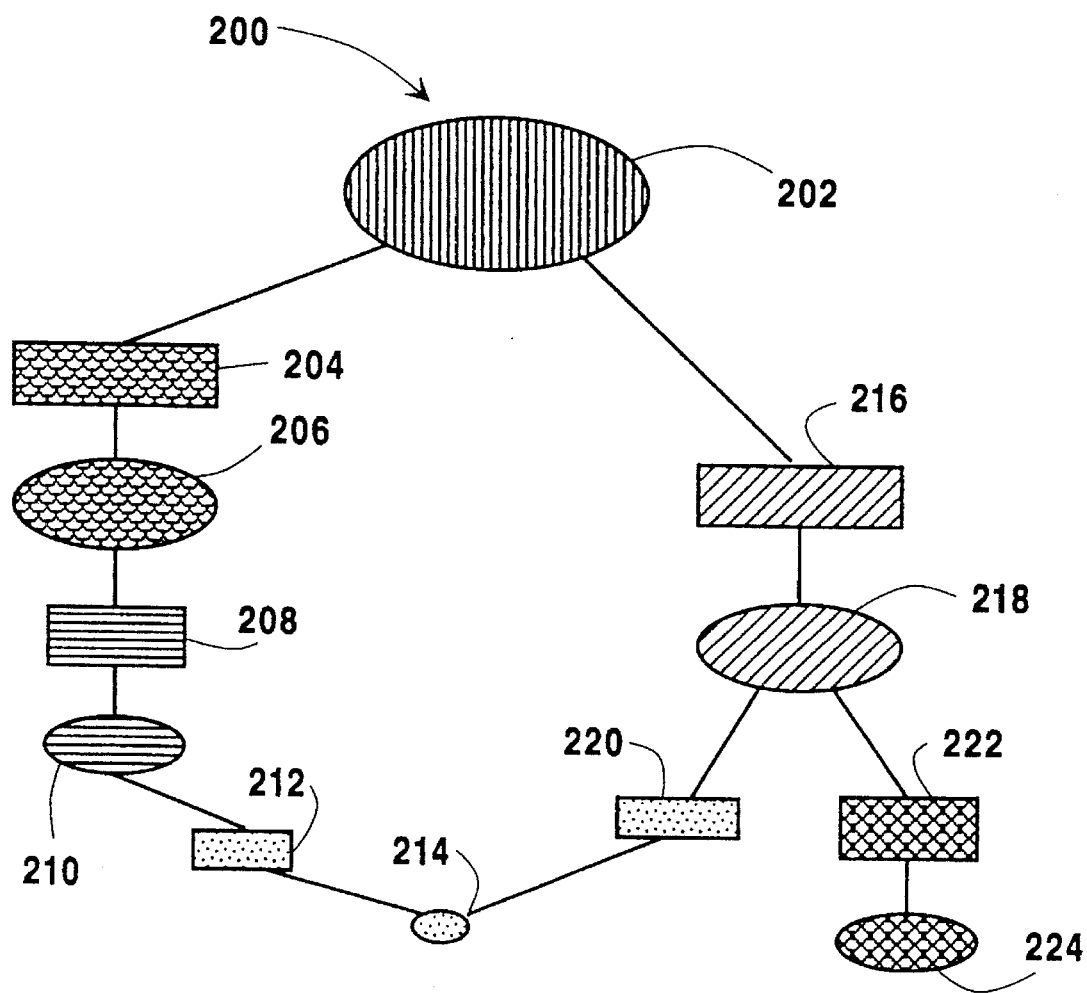
FIG. 2 is an enlarged view of the hierarchical area specification model of FIG. 1 resulting from the method of the invention when applied to the sample physical design image of FIG. 1
Figure 3:
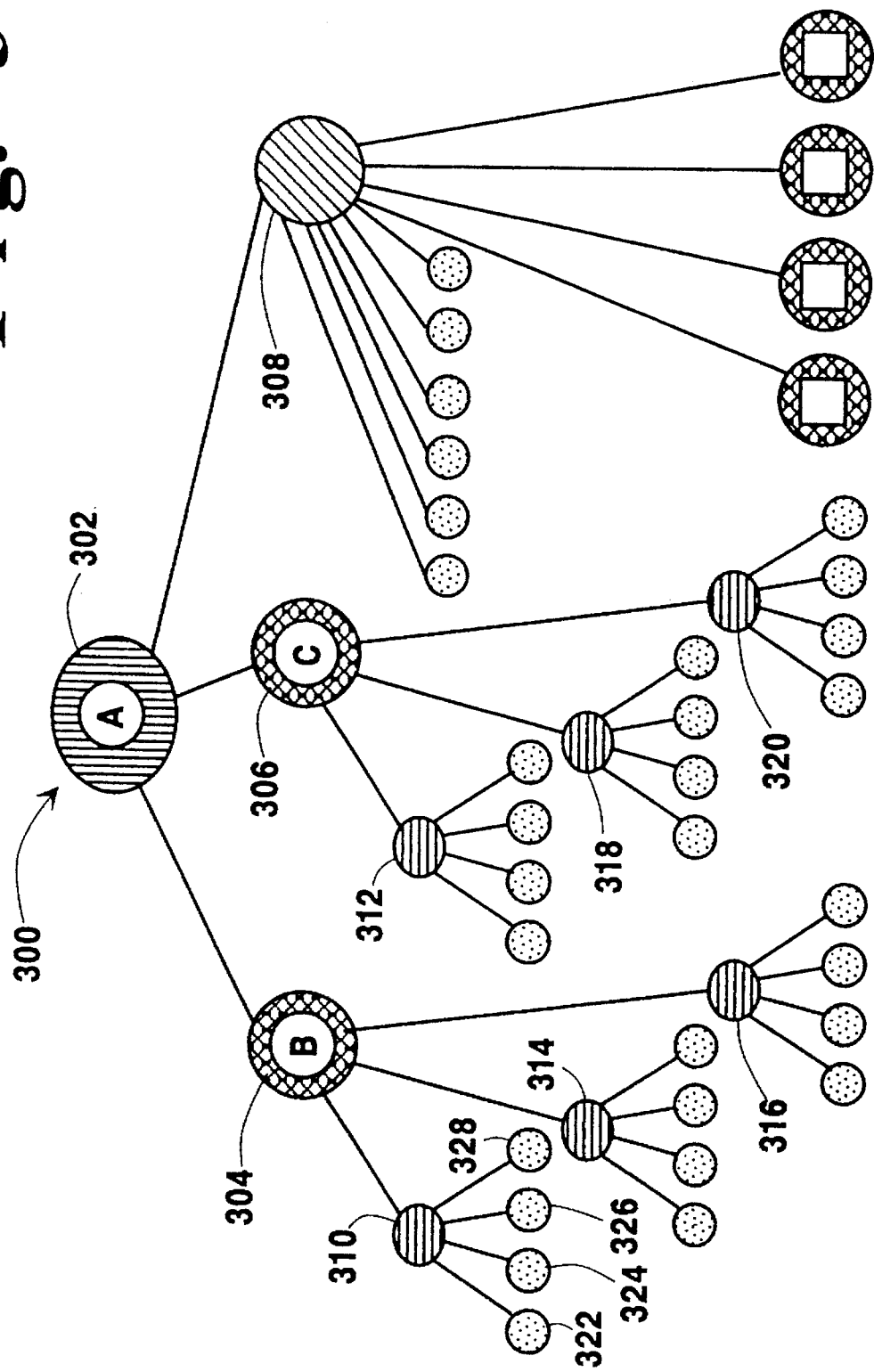
FIG. 3 is an enlarged view of the hierarchical area tree from FIG. 1 corresponding to the physical design image of FIG. 1.
Figure 4:
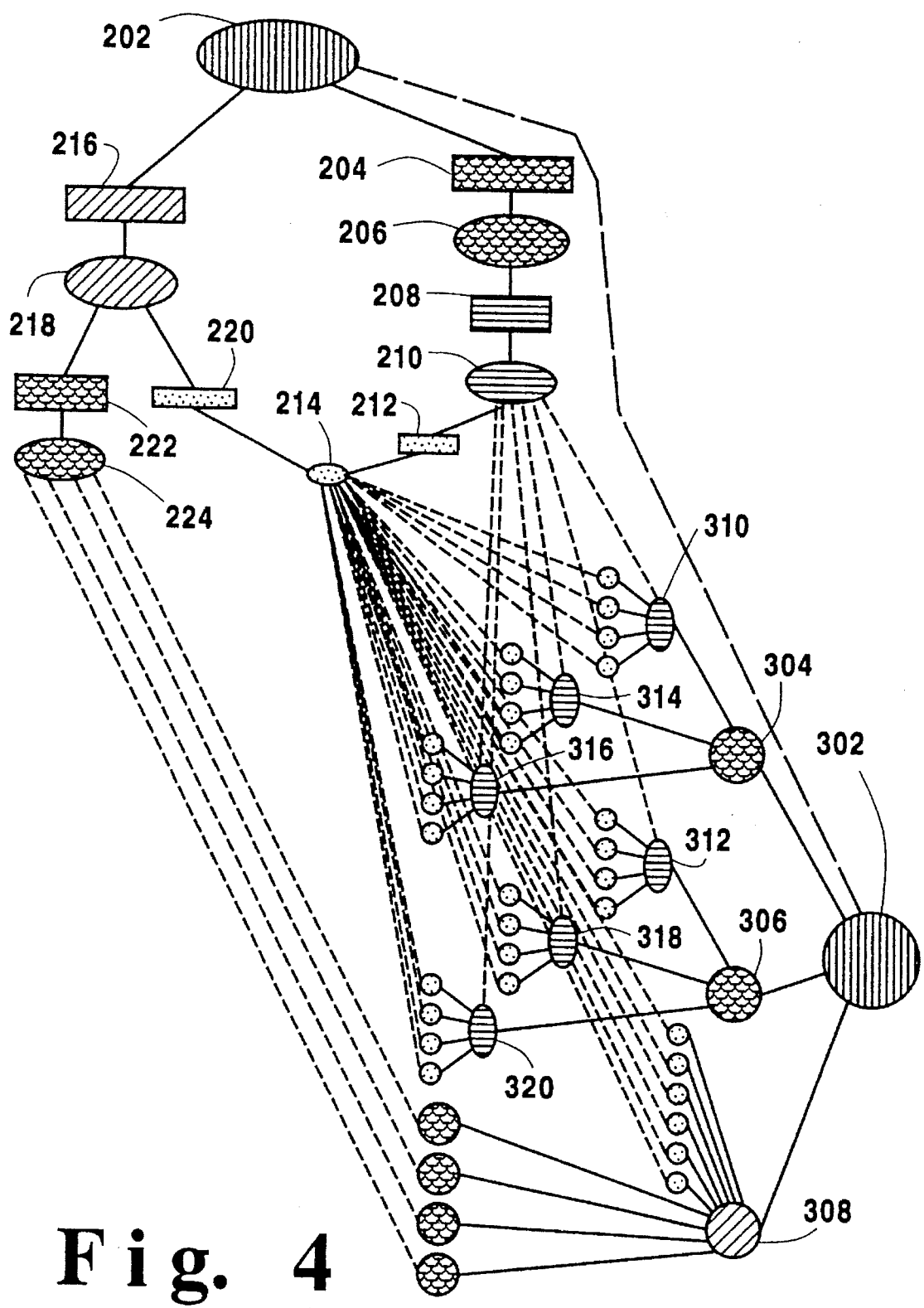
FIG. 4 represents the correspondence between the hierarchical area specification model of FIG. 1 and the hierarchical area tree of FIG. 1.

FIG. 1 provides an overview of the method of the invention with FIGS. 2-4 providing detailed views of particular portions of FIG. 1. The method starts with an image, typically a physical design image of a semiconductor layer in a package such as image 100, and restructures the information contained in that image into a hierarchically organized area specification data model 200.

The "area specifications" of the model describe the characteristics of areas on the image 100 which are important to an application program seeking to use the areas, e.g. for placement or wiring. The areas are hierarchically organized in an area tree 300 which is similar to the prior art quad area tree, previously described, in that there is a one-to-one correspondence between nodes in the tree and defined areas. The node 302 at the highest level designates the entire image area and the nodes (e.g. 322) at the lowest level (called "leaf nodes" because they are at the ends of the branches in the area tree) designate the smallest areas (referred to as "leaf areas").

One difference between the prior art quad tree structure and the structure of area tree 300, is that the structure of area tree 300 is not fixed, but is chosen during the method of the invention. Areas are defined during the method of the invention in a way which recognizes repeated patterns in the image and includes the patterns in identical areas. This process minimizes the number of different area specifications, allowing common information about such patterns to be store in a single location and referenced by pointers thereto.

FIG. 1 also illustrates a hierarchically restructured image 106. Both the hierarchically restructured image 106 and the area tree 300 give insight into how the information is structured, stored and accessed in the area specification model 200. Further illustrated in FIG. 1 is a graphical representation of how the information contained in the model is accessed via an encapsulation layer 108 through an application window 110.

The encapsulation layer 108 and the application window 110 are symbolic representations of how an application program accesses information in the model, delving to only a shallow layer for some large areas, where detailed information is not needed, and to deeper layers where more specifics are needed. Specifically being illustrated is a particular area of interest bounded by a rectangle 112. Rectangle 112 corresponds to a subset 114 of nodes in the hierarchical area tree 300.

It should be understood that the graphical image 100 corresponds to data in a computer, in the form of a bitmap model, containing information for each point in the image 100 (down to a desired granularity level). The drawing illustrates the form in which the information is provided to a conventional design application. The information is accessed by specifying the point of interest in the image. The difference between the background markings in the square areas seen on the left side of the representation 100 (areas 120 and 122 for example) and the background markings in the rectangular areas on the right side (areas 140 and 142 for example) indicates a difference between those areas which is relevant to an application seeking to use those areas for tasks such as placement of components or wiring.

The particular difference between the areas is not important to the method of this invention. The difference may simply be the difference in the physical shapes of the two areas, reflecting the fact that different types of circuits will fit into the different areas. Alternatively, it may reflect some surface characteristic, or other difference that is relevant to a particular application.

The method of this invention may even be used where all the areas are identical, as may occur in the initial design stages of some layer is of an integrated circuit package. The ability to select the differences between areas that are relevant to a particular application allows the same physical design image to be restructured in different ways according to the method of the invention to optimize the resulting hierarchical model for different applications.

The method may also be used on models which are already hierarchically organized. An existing hierarchy produced by a different model or by an earlier operation of the present invention will be flattened and reorganized differently for different applications.

Just as the image 100 is a graphical representation that approximates a bitmap model stored in a computer, the hierarchical area specification data model 200, graphically illustrated in FIG. 1, also corresponds to information that is actually stored in a computer. The graphical representation form 200 most closely represents the structure of the present model as stored in a computer because it illustrates how information about the attributes of an area (the area specifications represented by ovals, such as ovals 214 and 224 ) that is common to two or more different areas, i.e., areas 120 and 140, is stored in a single location in the computer. However, the representations in the form of the hierarchical area tree 300 and the hierarchically organized image 106 are also useful in understanding the method of restructuring and the model that results from the restructuring.

The typical application of this invention is to generate the "folded" hierarchical area specification model 200 representing the hierarchy of area specifications. Although in the process a hierarchical area treecorresponding to tree 300 is created, the process will typically dispose of the tree and keep the compact area specification model. A new area tree can easily be generated, if desired. Moreover, one need not create the full area tree in the process for the full design. On one hand, the implementation can simulate the creation of the tree by equivalent programming means. On the other hand, one can sub-partition the area and create only elements of the tree as needed to perform the process. Both possibilities can be combined.

A principal difference between the bitmap image model 100 and the hierarchical area specification model 200 is that information which is common to identical areas is stored in a single location in the model 200 and in many different locations in model 100. For example, it is obvious on viewing the image 100 that there are two types of areas, the thirty small square areas (areas 120 and 122 for example) and the four larger rectangular areas (areas 140 and 142 for example). These two types of areas are located on a substrate that corresponds to the entire package 102. In the bitmap image model, the information about the characteristics of area 120 is repeated in the storage locations corresponding to the points in areas 120 and 122, and all the points in the other twenty eight small square areas.

In the hierarchical area specification model, however, all of this information is stored in a single area specification indicated by oval 214. Since there are only two fundamental area types at the lowest level, there are only two area specifications, 214 and 224 (referred to as "leaf area specifications"), at the lowest level of the area specification model 200.

Thus, the hierarchical area specification model produced by the method of the present invention has two advantages over the prior art that are immediately apparent even upon this initial description. First, it closely follows the physical reality of the underlying packaging structure. There are only two fundamental types of areas in the image and two final area specifications at the lowest level of the model. Second, the model stores common information in a single location, resulting in less storage space being used.

The common information can also be "simulated" common information. The method of the invention will ignore any information which differentiates areas providing that the areas have common information that is relevant to the application or the application domain requiring the restructuring. In other words, differences can be ignored provided that those differences are not material to the application seeking to use the information.

The computer model resulting from this invention is described in terms of its components and the relationships between them. Each component by itself does not make up the model. It is the collection in its entirety, comprising the components as well as the relationships between the components that make up the model. This is an Entity-Attribute-Relationship (EAR) type of model. In such a data model, concrete real life things are represented by entities. The interactions between different entities are represented by means of relationships. The characteristics of each entity are represented by attributes. As an example, consider a data model representing a few circuits placed on a chip. There will be an entity corresponding to each circuit, and an entity corresponding to the entire chip in the data model. The fact that a circuit is placed on a chip will be represented in the model by means of a relationship between the chip entity and the circuit entity. The size of the chip will be represented by means of an attribute.

Before describing the method of generating the model from the image, it will be helpful to review the characteristics of the model in greater detail, with particular attention to how the model relates to the information in the image. FIG. 2 shows the same model 200 shown in FIG. 1, but at an enlarged scale. The model 200 is formed of area specifications, indicated by ovals (210 and 214, for example), alternating with rectangles (208 and 212, for example). The rectangles are area specification usage pattern entities and define the layout pattern of smaller areas (areas described by the area specification below the rectangle) within larger areas (areas described by the area specification above the rectangle).

The area specifications are organized hierarchically, each area specification containing one or more lower level area specifications, until the leaf area specifications are reached. Thus area specification 202 corresponds to the entire package 102 in image 100 and contains intermediate area specifications 206 and 218. Area specification 206 contains intermediate area specification 210 which contains leaf area specification 214 corresponding to all the small square areas (e.g. areas 120 and 122) in image 100.

The intermediate area specifications 206, 210 and 218 identify areas that are larger than the leaf areas 120 and 140 (corresponding to area specifications 214 and 224), but smaller than the complete package 102 (corresponding to area specification 202). Selecting appropriate intermediate area specifications for the model is an important step in the method of the invention.

The manner in which an image is hierarchically organized in the model and the intermediate area specifications and area specification pattern usage entities may be understood by considering the sample image in FIGS. 5(a)–5(d). In each of FIGS. 5(a)–(d), the drawing is divided between the left side and the right side. On the left of each drawing are one or more areas that have unique area specifications. On the right side is an image hierarchically organized with areas that match the area specifications on the left. As you proceed from FIG. 5(a) to FIG. 5(d) the area specifications on the left change from the lowest level (leaf area specifications) to the highest level (the entire area).

In FIG. 5(a) there are two area types 502 and 504 on the left. These areas are arranged in the patterns seen in image 506. In FIG. 5(b) the two cell types have been organized into 2×2 patterns forming intermediate level area specifications 508 and 510. This grouping is indicated by the hatched backgrounds behind the 2×2 patterns in image 512. At the next higher level, in FIG. 5(c), the area type 510 (composed of a 2×2 group of area type 502) has been further grouped into a 1×3 group to form area type 514. Area type 510, however, needs no further grouping. The two area types 514 and 510 are shown in image 516.

In the final drawing, FIG. 5(d), the two intermediate area specifications 510 and 514 are assembled into a final group 516 composed of the entire set of areas as seen in image 520. Hierarchically organized image 520 corresponds to image 506 as hierarchically organized image 106 in FIG. 1 corresponds to image 100.

Referring back to FIG. 2, area specification 210 describes an area large enough to cover four areas of type 214 arranged in a 2×2 pattern. One such group includes areas 120, 122, 130 and 132. This 2×2 sized group appears a total of six separate times in the packaging structure 100 as may be seen in the image 106. Referring to FIG. 1, corresponding area specifications (in model 200), areas (in image 106) and nodes (in the area tree 300) have all been marked the same way with identical background hatch marks.

There is one node in the area tree of FIG. 3 for every area in image 106 defined with a unique specification in model 200. For example, area 120 in image 106 is defined by area specification 214 and corresponds to node 322 in the area tree 300. Area 122 is also defined by area specification 214, but corresponds to node 324 in the area tree. All these areas and area specifications are marked the same way with a dotted background.

At the next higher area specification level, area specification 206 represents an area large enough to contain a group of three vertically stacked areas of the type described in area specification 210. Referring to FIG. 3, it can be seen that area specification 206 corresponds to nodes 304 and 306 and that each of these nodes contains three nodes corresponding to area specification 210.

Because there are an odd number of columns of areas of the type described in area specification 214, there is a left over vertical column of six such areas (the topmost of which is area 128) which cannot be included in the 2×2 grouping of area specification 210.

These six areas and the four rectangular areas 140, 142, 144 and 146 are included within a different area specification 218 corresponding to node 308 in area tree 300.

Figure 5:
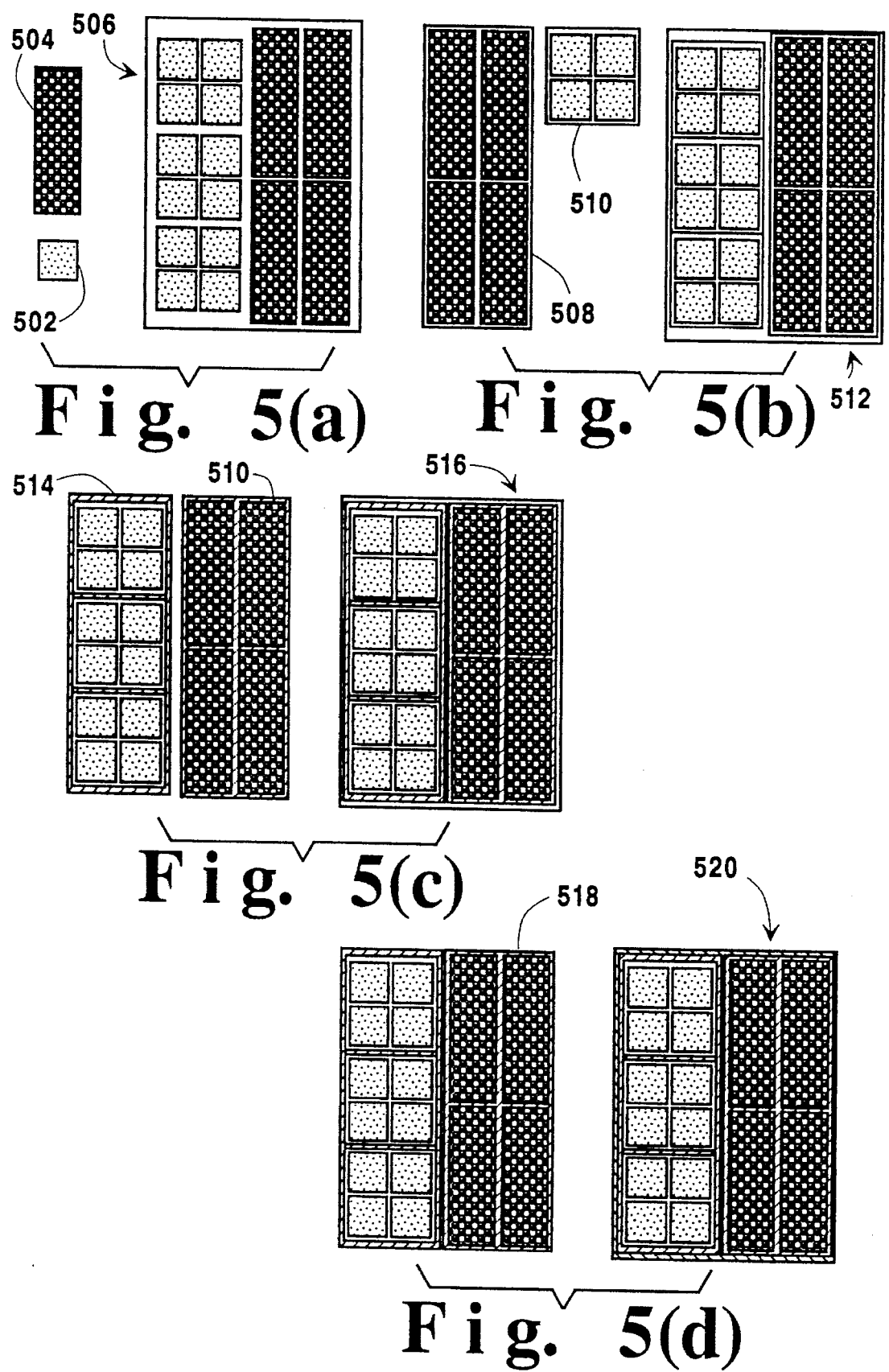
FIG. 5(a)–5(d) illustrates a second sample physical design image used in describing the steps of identifying leaf areas and grouping the leaf areas in the method of the invention.

The two areas corresponding to area specification 206 (nodes 304 and 306 in the area tree) and the single area corresponding to area specification 218 (node 308) are below area specification 202 (corresponding to node 302) in the manner described with reference to FIG. 5(*d*).

Starting at the top, the hierarchical area specification model of FIG. 2 can now be read as follows. The area of the complete package is defined by area specification 202. Rectangle 204 defines the location pattern and placement of two additional areas of the size defined by area specification 206 (large enough to hold twelve small square areas in a 2×6 pattern). Rectangle 216 defines the location of a single area of the type defined by area specification 218 (large enough to hold six small square areas in a 1×6 pattern and four rectangular areas in a 2×2 pattern).

As can be seen by the paths leading from area specifications 210 and 218 to leaf area specification 214, information about an area type may be stored in a single location even though an area of that type is placed in different larger areas having different higher level area specifications.

The information contained in the hierarchical area specification model 200 can be directly expanded into a hierarchical area tree 300 such as is shown in FIG. 3. The hierarchical area tree is also generated during the method of the present invention. The one-to-many correspondence between area specifications and nodes in the area tree is illustrated with dotted lines in FIG. 4.

The method of the invention can generally be described as proceeding in three stages from a starting image to automatically produce the final hierarchically organized area specification model.

In the first stage, referred to as "basic assembly", leaf areas are identified in the image, they are classified as being of one or more types accordingly to some characteristic of the leaf areas (relevant to an application), and adjacent leaf areas of equivalent type are grouped into one or more larger areas. These large areas containing identical adjacent leaf areas of a single type are referred to herein as "area arrays". Finally, area arrays that are of equivalent size and shape are identified. By identifying equivalent area arrays, only the unique area arrays need to be processed further. The results of the subsequent processing for each unique area array can then be directly applied to the corresponding equivalent area arrays.

In the second stage of the method, the unique area arrays are partitioned into areas, referred to herein as "partition areas". The first partition area corresponds to the entire area of the area array. Subsequent partition areas, if any, are smaller. The partitioning proceeds according to certain partitioning rules in an algorithm described below which creates patterns of smaller and smaller partition areas. When the same process is followed for area arrays of different shapes assembled from the same type of leaf area, the same patterns are often produced which results in common information storage about the partition areas when the area specification model is complete.

The partitioning is preferably done recursively with the first partitioning producing large partition areas and subsequent partitioning producing smaller partition areas until the leaf area size has been reached. Unique partition areas are then identified and area specifications are generated for them. Area specifications are also generated for the areas corresponding to the unique area arrays and for the unique types of leaf areas.

As a result, the area specification model produced will include the following area specifications listed in order of decreasing area size at decreasing levels of the model:

a single area specification corresponding to the entire image area, at least one intermediate area specification for the first partition area corresponding to each unique area array resulting from the basic assembly stage, dependent upon the partitioning criteria, additional intermediate area specifications may be created at one or more lower levels corresponding to the unique types of smaller partition areas, and one area specification for each unique type of leaf area.

In the third stage of the method, referred to as "post-processing grouping", additional area specifications may optionally be introduced into the model to decrease the number of higher level area specifications. This improves efficiency and increases access speed to the data in certain applications.

Summarizing, the method includes the following principal steps:

a). providing an image;

b). identifying leaf areas in the image;

c). classifying the leaf areas as being of one or more unique types according to a characteristic of the leaf areas.

d). grouping adjacent leaf areas of equivalent type into one or more area arrays;

e). recognizing equivalent area arrays and forming a set of one or more unique area arrays;

f). partitioning each unique area array into one or more partition areas;

f). recognizing equivalent partition areas and forming a set of one or more unique partition areas and, g). generating an area specification for an area corresponding to the entire image area, each unique partition area and each unique leaf area.

The post-processing grouping stage will be needed only in some implementations of the invention depending upon the partitioning criteria and the starting image.

Figure 6:
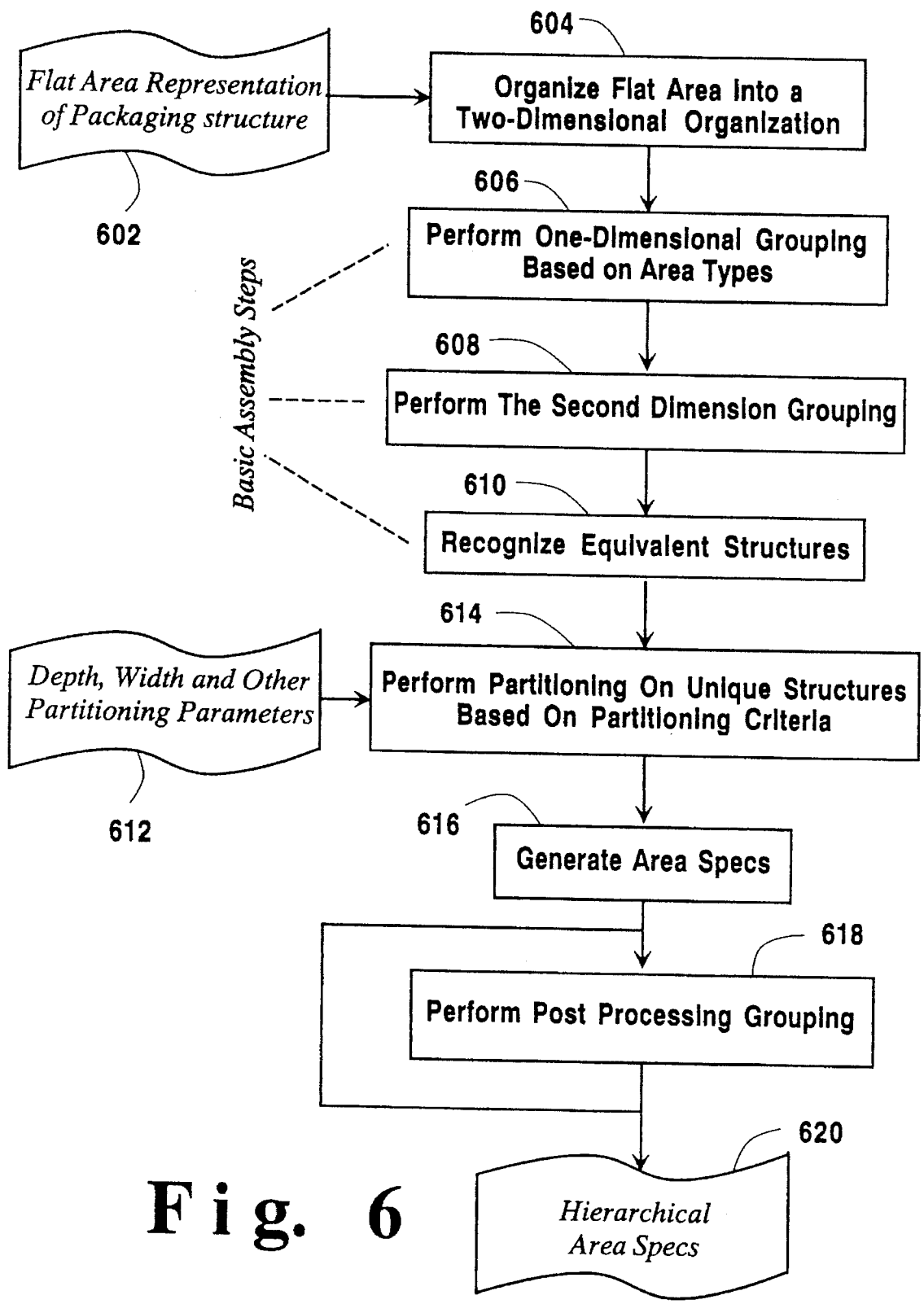
FIG. 6 is a flow diagram illustrating the steps in a preferred embodiment of the present invention.

FIG. 6 provides one embodiment of the invention according to the above described method. A flat area representation of a packaging structure 602 with leaf areas is provided in image form in step 604. The leaf areas are of different types, according to the differences that are of importance to the application to use the model. Thus, different distinctions between areas may be made at this point to identify features that are relevant to the application that will use the model and ignore distinctions between areas that are not relevant.

In this embodiment of the method, the leaf areas are grouped into the area arrays in a two step process. First, in step 606, the image is scanned in one dimension to recognize leaf areas that are of equivalent type and are adjacent in the scanning direction. Second, in step 608, the image is scanned and grouped in the second dimension. The result of the two direction scanning is to identify all area arrays within the image composed of adjacent identical leaf areas. Steps 606 and 608 completely divide the image into mutually exclusive areas comprising the area arrays. The term "area array" is used because the two dimension scanning process produces areas composed of vertical columns and horizontal rows of leaf areas. Finally, equivalent area arrays, i.e., areas of identical size and shape or other unifying characteristics, are identified in step 610.

Figure 7:
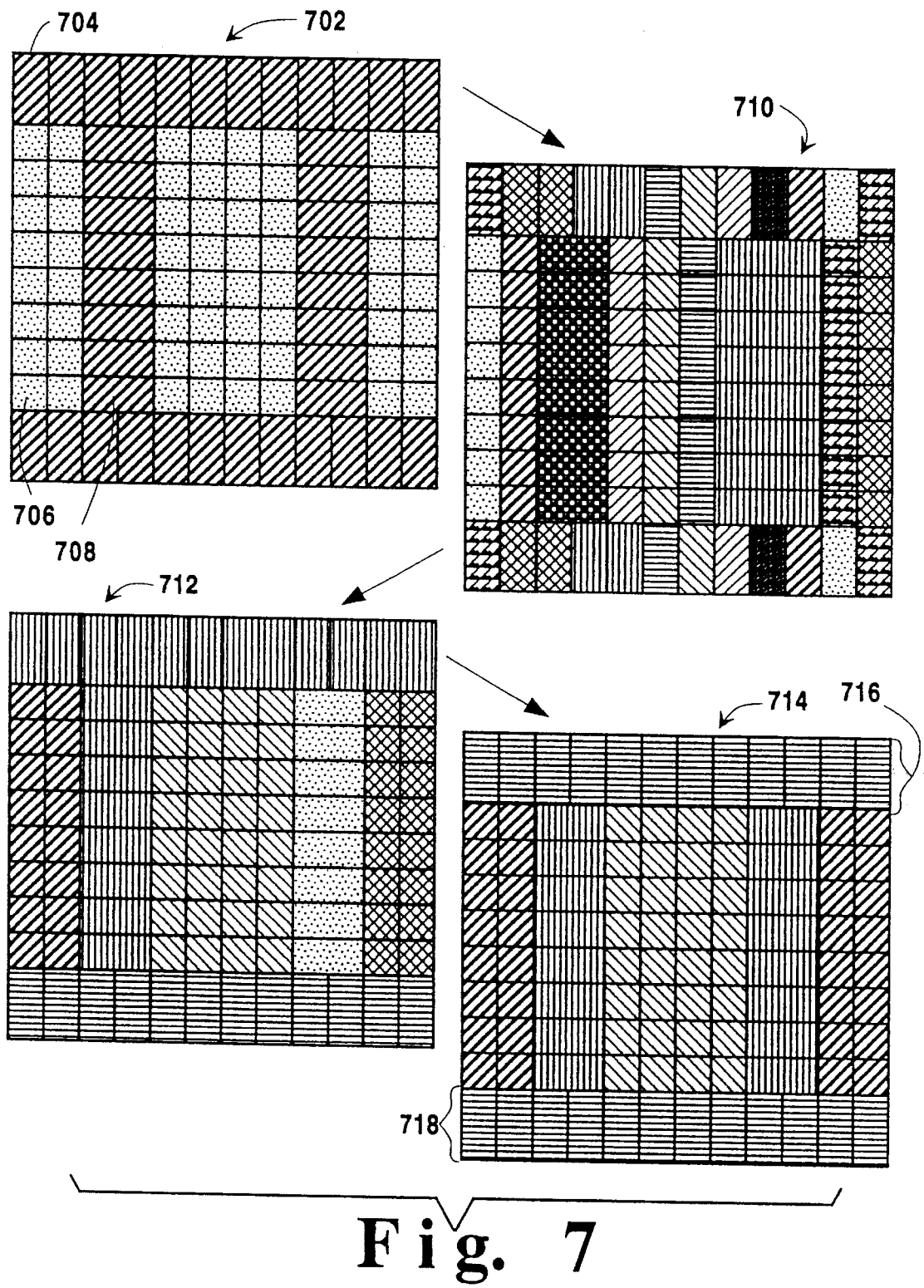

These basic assembly steps, following the above-described method, are graphically illustrated in FIG. 7. The flat image 702 includes two types of leaf areas: rectangular areas (e.g. 704) and square areas (e.g. 706). Area 708 is identical to area 704 except that it is turned 90°.

The results of the one dimensional (vertical) grouping of step 606 are shown in 710. During the vertical scan, adjacent leaf areas of identical type are grouped together into vertical groups as indicated by the different background markings in 710. The results of the second dimensional grouping in step 608 are illustrated in image 712.

The results of the final basic assembly step 610 are shown in image 714 in which equivalent area arrays have been identified. The top area array (vertically striped in image 712) and the bottom area array (horizontally striped in image 712) are equivalent area arrays and are identified as equivalents 716 and 718 in image 714 by marking both with horizontal striping. The outer two area arrays (diagonal stripes) and the inner two areas (marked with a grid pattern) have also been identified as being equivalent.

Thus, upon completion of the basic assembly steps, all contiguous areas composed of identical leaf area types have been identified to form a set of one or more unique area arrays. Each of the unique area arrays will be partitioned. Thus, in image 714 the upper area array 716 will be partitioned and the partitioning for that area array will also apply to area array 718 at the bottom of image 714.

Although the preferred method of identifying the unique area arrays is done as illustrated in FIGS. 6 & 7 with a two dimension scanning process, other methods may be used which identify adjacent leaf areas of equivalent type and assemble them into area arrays.

Referring back to FIG. 6, steps 614 and 616 are the steps involved in the partitioning stage. In order to partition, certain partitioning criteria and partitioning parameters 612 need to be provided. These parameters may be set by the type of application program to use the information or by other processing constraints.

Starting with a unique area array of size $N_x$ by $N_y$ leaf areas, the primary constraints are:

1) a Desired Number Of Leaf Areas Range, 2) a Desired Number Of Children At Higher Levels Range, and 3) a Desired Minimum Number Of Children In One Direction At Leaf Level.

Ranges given throughout this description represent minimum and maximum integer values that determine the boundaries of the range. The partitioning proceeds recursively in an area restructuring algorithm to satisfy these constraints and a second level of constraints is used in order to direct the partitioning process to produce the following:

1) regular partition areas that can be specified in a step and repeat fashion, 2) partition areas that are as close to a square form as possible, and 3) a reduction in the overall number of area specifications by minimizing the number of different area specifications at any level.

The Desired Number of Leaf Areas Range indicates the target number of leaf areas at the lowest level of the area hierarchy tree. This target can be supplied by the user based on prior experience or determined in a separate algorithm step that attempts to balance a desired height of the tree and a typical number of branches in the tree that optimizes the tree structure for typical searches. The number is derived by utilizing the total number of leaf areas and attempting to generate a tree that has a Depth (Height), defined as the distance between the root and the deepest leaf, that is determined internally to permit for tree searches of logarithmic orders of the numbers in the Desired Number of Children At Higher Levels Range. This type of operation is well known to those skilled in the art of algorithm development.

The invention targets to achieve popular low numbers (when the numbers for Desired Number of Children At Higher Levels Range numbers are not supplied) such as 4 (quad trees, etc.) so that the number of children at the highest level of the tree is small and, the lowest levels of the tree have a larger number of children before "leaf level".

For some applications, there are operations that may not be as efficient when operating on a tree structure as when they have some specialized "flattened structure" with a large number of immediate siblings in the tree. One example is performing a search for immediate neighbors. In order to find a balance between a fast relocation in the tree down to the desired area and the requirements of neighborhood searches, the invention attempts to create a smaller number of children at the top (if so desired) and a larger number of children at the lowest level in the hierarchy (if so desired) such that the neighborhood searches in the final structure can be performed as quickly and efficiently as possible with an equivalent flattened representation as in a grid map.

The desired number of leaf areas can be derived from a Desired Area Range for different area leaf types when the Desired Number of Leaf Areas Range is not supplied or to find the best number of Leaf Areas when the Desired Area Range is supplied. If this range is not supplied, the invention will derive it in steps that follow the same procedure outlined for deriving the Desired Number of Leaf Areas Range. This time the calculation includes the actual size of the area in the calculation of the depth of the tree.

In a further refinement of the Desired Area Range, one can provide a Desired Aspect Ratio Range. An aspect ratio is the division of the width to height of the perimeter of an area. Typically, the numbers for aspect ratios are not integers and include fractions. The invention attempts to generate areas with aspects ratios that approach "1", if a range is not provided. The default aspect ratio of "1" between the width and height of an area represents an area which is "square".

The derivation of the Desired Number of Leaf Areas Range and the Desired Area Range is performed concurrently when both ranges are not supplied. The Desired Minimum Number of Children in One Direction at Leaf Level is determined using the Desired Number of Leaf Areas Range and the Desired Area Range in combination with the Desired Aspect Ratio Range.

Note that in more general terms, one can determine any of the parameters in the invention as follows:

1) Exhaustively search all possible combinations from a selected range when it is practical, i.e., the range is limited, 2) Utilize combinations supplied to the program. Typically, the numbers are supplied by the user that relies on past experience or in attempts to improve the results of a previous run of the program, and 3) Use a cost function that drives the determination of the numbers based on criteria that resembles the ones outlined above.

FIG. 8(*a*) illustrates the partitioning of the central area array in image 714 according to the area restructuring algorithm. The central area array is composed of a 4×8 array of leaf areas of type similar to area 706. In the first step, the central area array 802 is split into four partition areas 804, 806, 808 and 810. In a second iteration of the restructuring algorithm area 804 is partitioned into a 2×4 array of leaf areas of the type identical to area 706.

The partitioning of area arrays attempts to make each unique area array into a large number of smaller areas in successive recursive iterations. The starting area array is the result of the basic assembly steps given above. The automatic area restructuring algorithm is a recursive process and has two components in the following algorithmic description.

Partition ($N_x * N_y$)*

1. If ($N_x * N_y$) is in the Desired Number of Leaf Areas Range then Exit.
2. Create the Set of Area Slices—Area Slice (New $N_x$, New $N_y$)—by performing the Find Slices ($N_x$, $N_y$) Operation.
3. Process the slices generated in step 2 to determine if equivalent slices exist. Drop the redundant slices from the set.
4. Process the remaining set of slices to identify and drop from the set the slices that have already defined area specifications.
5. For Every District Slice in the Set of —(New $N_x$, New $N_y$)—:
    5.1 Create a New Area Specification.
    5.2 Perform Partition (New $N_x$*New $N_y$).

Find Slices ($N_x$, *$N_y$).

1. Initialize the Set of Area Slices—Area Slice (New $N_x$, New $N_y$)—. Direction of Partitioning to that with the value of the largest of ($N_x$, $N_y$).
2. Repeat until the size of the Set of Area Slices—Area Slice (New $N_x$, New $N_y$)—are in Desired Number of Children At Higher Levels Range and with Minimum Number of Possible Area Specifications (i.e., distinct slices and any slice for which there already exists an Area Specification from the general processing will not count).
    2.1 Determine New Direction of Partitioning (the direction with $N_x$ or $N_y$) such that any $N_x$ or $N_y$ that is below the Desired Minimum Number of Children in One Direction at Leaf Level will not be partitioned.
    2.2 With the New partitioning direction,
        2.2.1 Divide the Number of Leaf Areas in that Direction by (2 to Maximum of the Desired Minimum Number of Children At Higher Levels Range).
        2.2.2 Combine the resulting numbers of Partitions in $N_x$ and $N_y$ directions to Determine the number of resulting Area Slices.

With the Numbers from step 2.2.2, repeat until one set of numbers is accepted:

Drop any Combination that results in a number of Area Slices not in Desired Number of Children At Higher Levels Range, does not result in a partition that has an existing area specification and, providing there will be at least one partition left.

Drop all the numbers that results in partitions that are not in Desired Aspect Ratio Range, does not result in a partition that has an existing area specification and, providing there will be at least one partition left.

2.3 Incorporate Resulting Partition in the Set of Area Slices.

These two procedures are performed automatically by computer to divide the area arrays into successively smaller partition areas. The first procedure, Partition ($N_x * N_y$), creates the area specifications and decides whether smaller partition areas are needed. The second procedure slices large partition areas into smaller ones when needed. The slicing, when done according to the described procedure, tends to produce areas that are reproducible in a step and repeat fashion. The controlling criteria for the procedures can be adjusted to produce models that are particularly suited for particular design applications that need to use the resulting model.

Figure 8A:
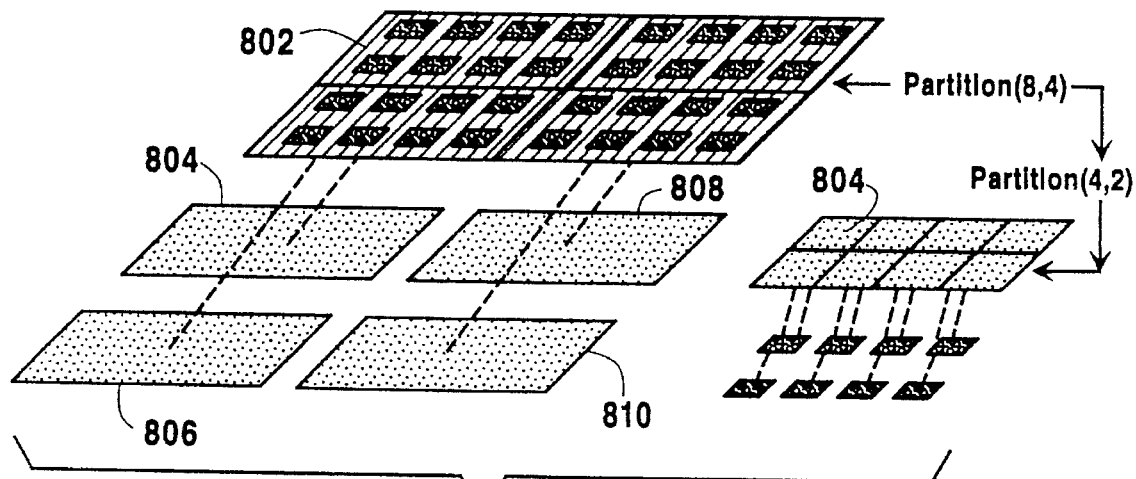
FIG. 8(a) illustrates the step of partitioning a unique area array from FIG. 7 into partition areas down to a desired granularity.
Figure 8B:
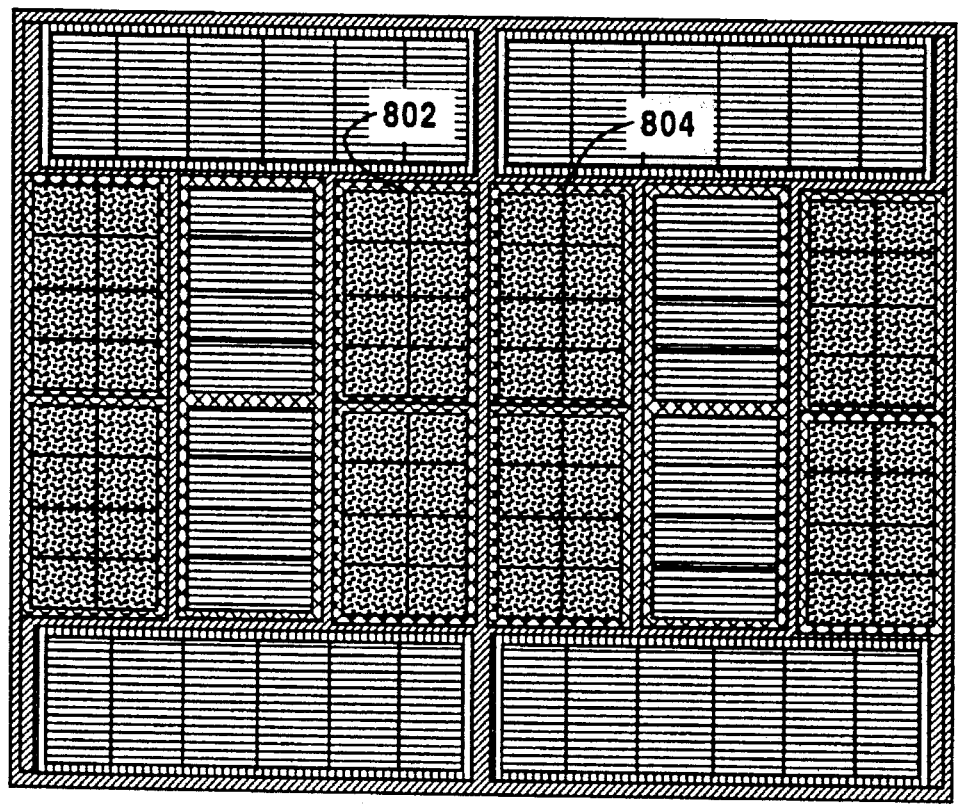
FIG. 8(b) illustrates the hierarchically restructured package that corresponds to the physical design image of FIG. 7.

FIG. 8(a) illustrates the result of the partitioning process on the central region of the image. In the first step of the recursive partitioning process, the partition criteria includes a Desired Minimum Number Of Children In One Direction At Leaf Level that included the numbers 4, 6 and 8. The constraint Desired Number Of Children At Higher Levels Range is 2–4. FIG. 8(b) shows the corresponding expanded hierarchical area structure. Note that the area made of 2×4 leaf areas are the same across the entire package thereby minimizing the overall number of area specifications. The information about these areas can be shared.

Following the partitioning process, area specifications are generated. Area specifications are generated and recursively refined until the specification is completed when all the information becomes available. Also generated are the area specification usage pattern entities which account for the structural relations between the children areas and the parent area. In principle, this step accounts for the abstraction of the characteristics of lower areas and abstracting them at the higher level areas. Note however that the creation of a new area specification occurs at the time of deriving its descendent areas. This implies that the area specification derivation will be a step behind the area partition. However, some implementations of the method may elect to integrate the area specification derivation with the area partitioning steps. The hierarchical area tree that will be generated from the area specification creation process, up to this stage, for the example package of FIG. 7 is shown in FIGS. 9(a) and 9(b). In FIG. 9(a), node 902 corresponds to the entire image. Nodes 904–916 correspond to the seven area arrays identified in image 714. There is a one to one correspondence between these nodes and the area arrays. The background markings of the nodes match the background markings of the area arrays in image 714 to which they correspond.

The rectangular nodes (e.g. 918, 920) correspond to multiple areas, including all the partition areas resulting from the recursive area restructuring algorithm down to the leaf areas. The multiple individual nodes to which the rectangular nodes correspond are shown in FIG. 9(b). For example, rectangular node 930 includes nodes 950 and 952. Node 950 corresponds to area 804 while node 952 corresponds to one of the 8 leaf areas within area 804.

Because rectangular nodes 922, 924, 930, 932, 934, 936, 942 and 944 are identical, the information they contain can be shared and stored in a single location resulting in an 8-fold decrease of storage space.

Figure 11A:
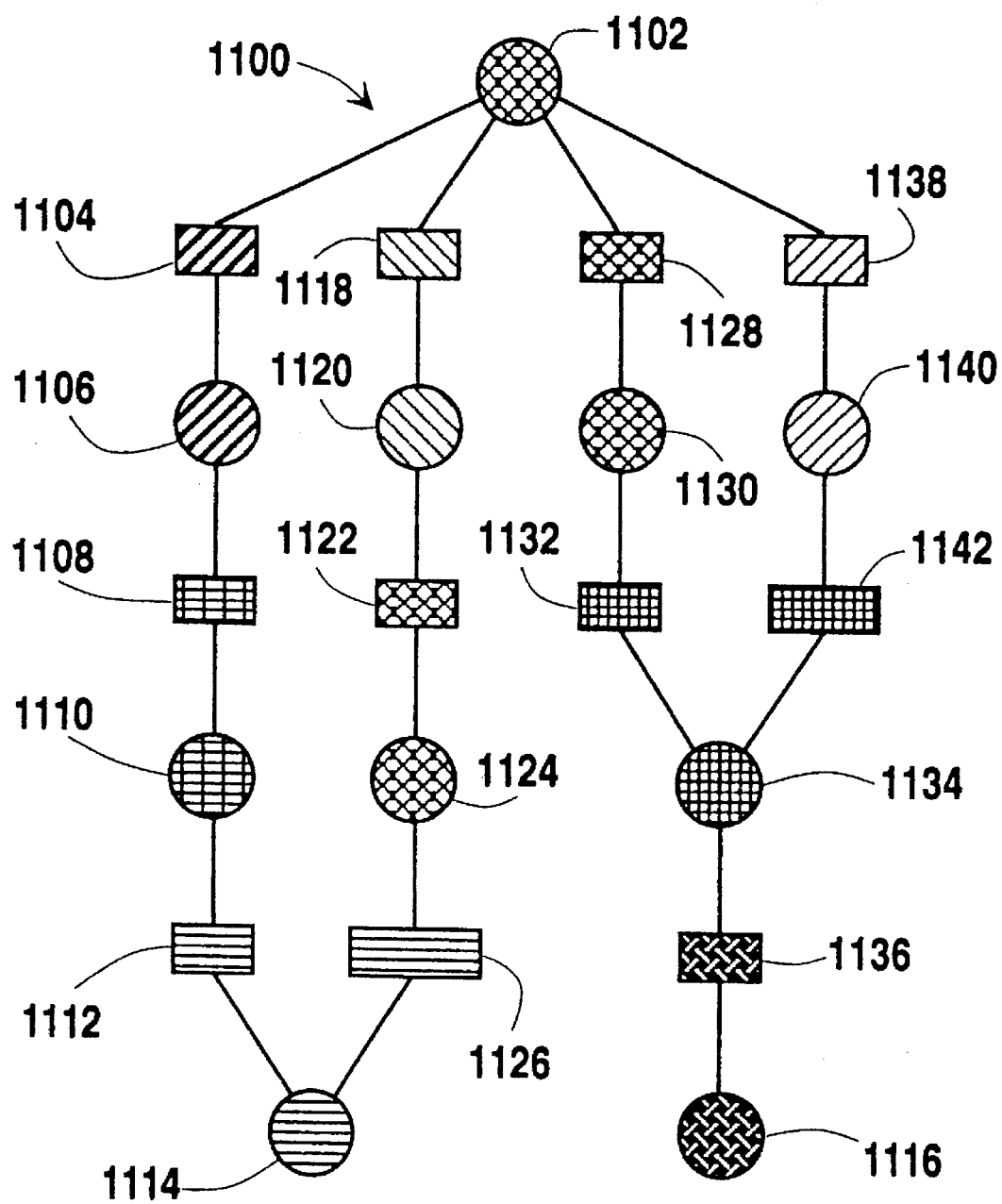
FIGS. 11(a) and 11(b) illustrate the hierarchically area specification model produced by the method of the invention which corresponds to the physical design image in FIG. 7 before and after the step of post processing grouping.

FIG. 11(a) illustrates the hierarchical area specification model generated by the method of the invention for the hierarchically restructured image in FIG. 8(b). Area specifications are shown with circles and area specification usage pattern entities are shown with rectangles. Area specification 1102 corresponds to node 902 in the area tree and to the entire image area. Area specification 1106 corresponds to nodes 904 and 916 in the area tree of FIG. 9(a). Area specification usage pattern entity 1104 refers to the two areas having area specification 1106 and defines their relative locations within the entire image area having area specification 1102.

Area specification 1110 corresponds to 4 nodes in the area tree of FIG. 9 symbolized by square nodes 918, 920, 946, 948. One such node within square node 918 is node 954.

As occurs in every hierarchical area model according to the present invention, there is a single top area specification corresponding to the entire area (1102) and one area specification at the bottom for each unique type of leaf area (2 area specifications (1114 and 1116).

Note that at two locations within the hierarchical area specification model 1100 separate branches of the model merge into a single area specification. This occurs at area specification 1114, which is a leaf area specification, and at area specification 1134. This merger indicates that identical leaf areas or identical intermediate areas are found in two different area arrays and the information that is common is stored in a single location.

Figure 10:
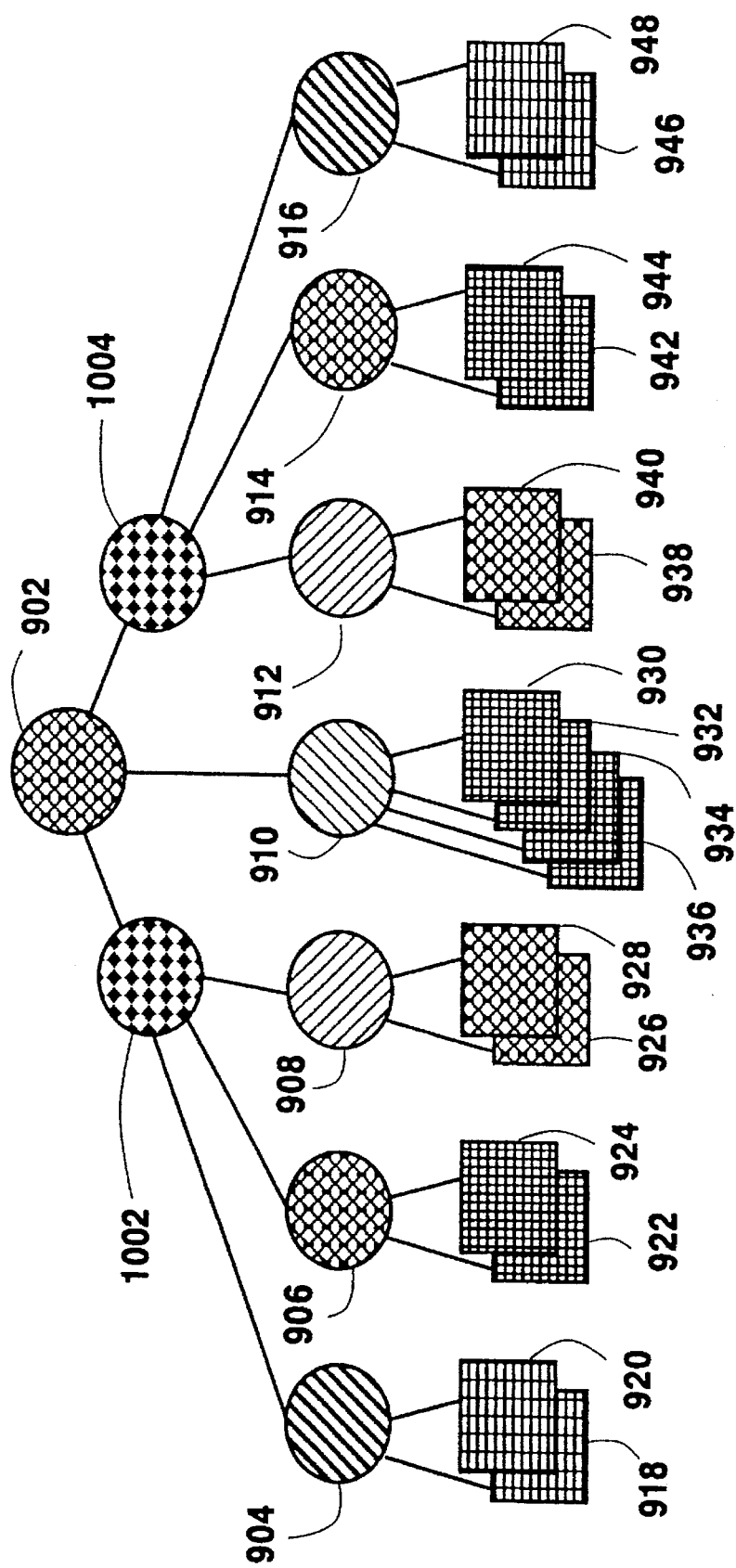
Figure 11B:
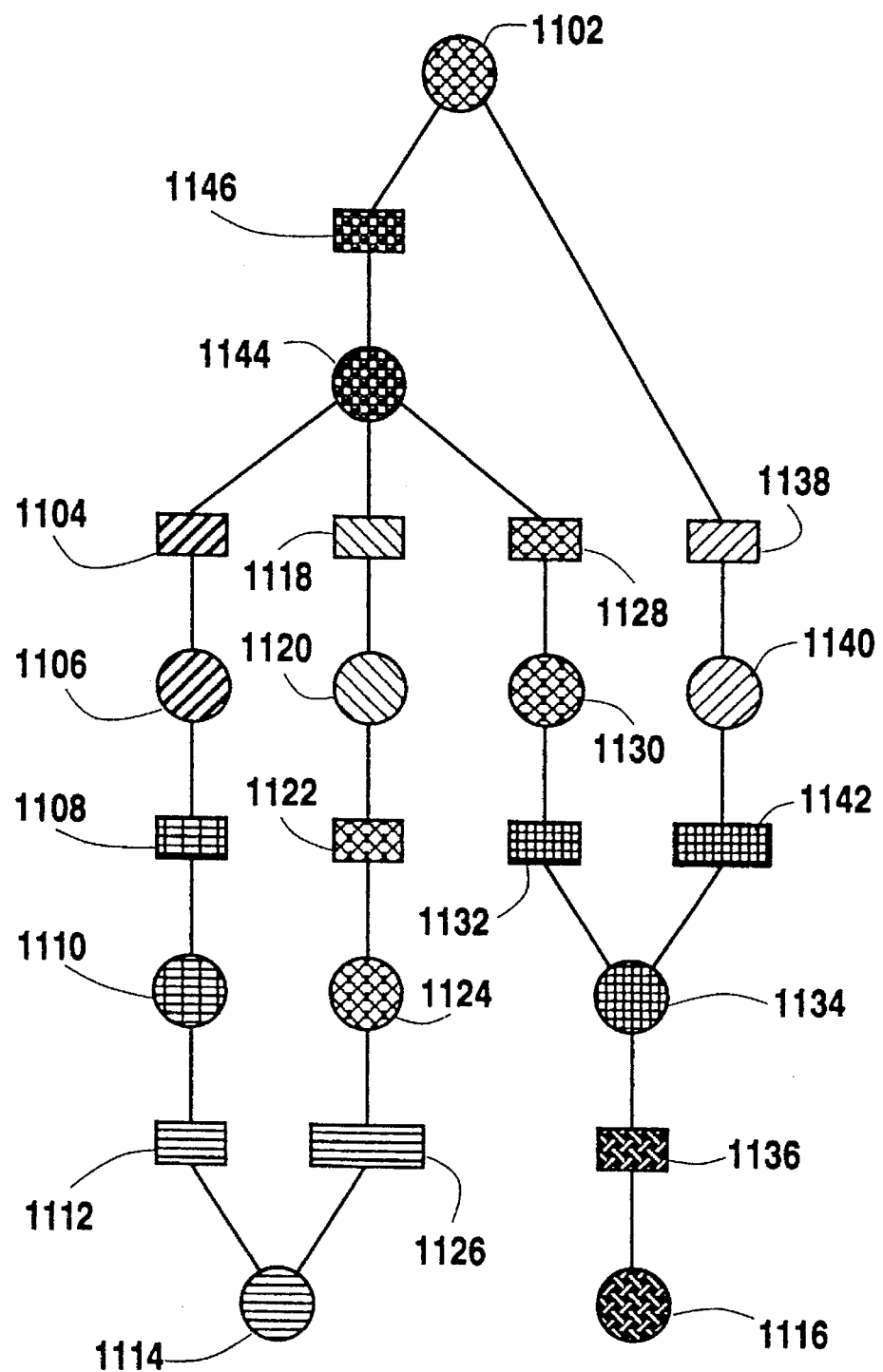

The final post-processing stage of the method is shown in FIGS. 10 and 11(b). FIG. 10 corresponds to FIG. 9(a) except that two new nodes 1002 and 1004 have been introduced into the area tree. It may occur that there are a large number of area specifications at the top of the tree when built based on the partitioning steps previously described. Therefore, in order to meet the partitioning criteria fully, the post-processing stage performs a grouping of the high level area to reduce the number of children of the root area by introducing additional area specifications at the top. FIG. 10 illustrates the situation of post-processing grouping to satisfy the given Desired Minimum Number Of Children In One Direction At Leaf Level criteria.

Post-processing grouping proceeds according to a top level grouping algorithm as follows:

Top Level Grouping

Repeat until the Number of the Children at Top Level of the Area Tree is in the Desired Number of Children At Higher Levels Range.

1. Label Temporarily all Children of Top Level of the Area Tree as belonging to one fictitious Simulated Leaf area type. (The object of this labeling will be clear below.)
2. Determine the New Desired Leaf Area Assembly Range as equal to the Desired Number of Children At Higher Levels Range.
3. Perform all Basic Assembly Steps on the Simulated Leaf areas of the Top Level of the Area Tree in a fashion similar to that performed originally for the actual leaf areas. The only difference now is to eliminate redundancy in the Horizontal and vertical scan such that Simulated Leaf elements do not get included in more than one array area.
4. Perform the Partition ($N_x*N_y$) algorithm steps with the following modification:
   Treat Simulated Leaf areas similar to real leaf areas except when performing the steps of creating new area specifications and when determining whether the operation minimizes the number of area specifications. In those steps, the Simulated Leaf areas are operated upon using their actual original area specifications.

FIG. 11(b) illustrates the effect of introducing additional areas and nodes during post processing on the hierarchical area specification model. Two new areas indicated by nodes 1002 and 1004 in the area tree are defined, representing a single new area specification 1144 in the area specification model. Corresponding usage pattern entity 1146 contains the information that there are two new areas and the information about their relative location within the image.

Particular implementations of the method may include processing steps that automatically generate names for the areas and/or obtain the original names and provide structures that will store in an appropriate fashion to be utilized in a step of delivering the hierarchical area tree when a physical design application requests it.

By proceeding with the method and appropriately selecting desired parameters, a reusable hierarchical model can automatically be constructed from existing images. The process is parameterizable to construct a graph model from which efficient tree structures will be obtained. The method automatically recognizes common shareable structures during the process of generating shareable area specifications. The method permits decoupling the actual act of designing the structures from their intended use by applications by effectively permitting the restructuring of flat images/areas or hierarchically designing areas into tailorable hierarchical area models The designer of the structure underlying the images is freed from the burden of identifying the best structure needed for a general set of physical design applications. The hierarchical area models are reusable and reproducible very efficiently by automating and parameterizing the process of restructuring. Most importantly, the method provides for the capability of obtaining information that is not available when looking at the original design, whether the design is flat or hierarchically structured according to prior art method.

It will thus be seen that the objects set forth above, among those made apparent from the preceding description, are efficiently attained and, since certain changes may be made in the above method without departing from the spirit and scope of the invention, it is intended that all matter contained in the above description or shown in the accompanying drawings shall be interpreted as illustrative and not in a limiting sense.

While the invention has been illustrated and described in what are considered to be the most practical and preferred embodiments, it will be recognized that many variations are possible and come within the scope thereof, the appended claims therefore being entitled to a full range of equivalents.

Thus, having described the invention, what is claimed is:

1. A method for restructuring a physical design image into a data model comprising the steps of:

providing a physical design image;

identifying leaf areas in the physical design image;

classifying the leaf areas as being of one or more types according to a characteristic of the leaf areas;

grouping adjacent leaf areas of equivalent type into one or more area arrays;

recognizing equivalent adjacent and non-adjacent area arrays and forming a set of one or more unique area arrays;

partitioning each unique area array into one or more partition areas;

recognizing equivalent partition areas and forming a set of one or more unique partition areas; and generating area specifications for each unique partition area and for each unique leaf area.

2. A method for restructuring an image into a data model according to claim 1 wherein the step of grouping adjacent leaf areas of equivalent type into one or more area arrays comprises the steps of:

scanning the image in a first direction;

grouping leaf areas of equivalent type that are adjacent in the first direction to form one dimensional area arrays;

scanning the image in a second direction; and grouping equivalent one dimensional area arrays that are adjacent in the second direction to form the area arrays.

3. A method for restructuring an image into a data model according to claim 1 wherein the step of partitioning each unique area array comprises partitioning each unique area array into a hierarchical array of one or more partition areas.

4. A method for restructuring an image into a data model according to claim 3 further comprising the step of organizing the unique area specifications into a hierarchical area specification model.

5. A method for restructuring an image into a data model according to claim 1 wherein the step of partitioning comprises recursively partitioning each unique area array according to desired partitioning criteria to form a hierarchical array of one or more partition areas.

6. A method for restructuring an image into a data model according to claim 5 wherein the partitioning criteria are selected to produce a model for use by a particular application.

7. A method for restructuring an image into a data model according to claim 5 wherein regular partition areas are created that can be specified in a step and repeat fashion.

8. A method for restructuring an image into a data model according to claim 5 wherein partition areas that are as close to a square form as possible are created.

9. A method for restructuring an image into a data model according to claim 5 wherein the number of different types of partition areas are reduced by identifying identical patterns of leaf areas to reduce the number of different area specifications.

10. A method for restructuring an image into a data model according to claim 1 wherein the step of identifying leaf areas includes the step of flattening the hierarchy and creating leaf areas if the image has been previously organized into a hierarchy.

11. A method for restructuring an image into a data model according to claim 1 wherein the step of classifying the leaf areas as being of one or more types ignores different characteristics between areas provided that such areas have common characteristics relevant to an application.

12. A method for restructuring an image into a data model according to claim 1 further comprising the steps of storing the data model and generating an area tree from the stored data model whenever desired.

13. A method for restructuring an image into a data model comprising the steps of:

providing an image;

identifying leaf areas in the image;

classifying the leaf areas as being of one or more types according to a characteristic of the leaf areas;

grouping adjacent leaf areas of equivalent type into one or more area arrays;

recognizing equivalent area arrays and forming a set of one or more unique area arrays;

recursively partitioning each unique area array by desired partitioning criteria to form a hierarchical array of one or more partition areas according to a sequence of steps including:

(a) exiting the sequence of steps if an area of $N_x$ by $N_y$ leaf areas has a number of leaf areas within it that is within a predetermined Desired Number of Leaf Areas Range;

(b) creating a set of area slices of size New $N_x$, by New $N_y$ leaf areas by slicing the area of $N_x$ by $N_y$ leaf areas;

(c) recognizing equivalent slices from the set of area slices and removing redundant slices to form a set of unique area slices;

(d) identifying slices from the set of unique area slices that have previously been assigned an area specification and removing such slices from the set of unique area slices; and (e) for every remaining distinct slice in the set of unique area slices performing the steps of:

(i) creating a new area specification, and (ii) repeating the sequence of steps substituting New $N_x$ and New $N_y$ for $N_x$ and $N_y$;

recognizing equivalent partition areas and forming a set of one or more unique partition areas; and generating area specifications for each unique partition area and for each unique leaf area.

14. A method for restructuring an image into a data model according to claim 13 wherein the step of creating a set of area slices by slicing the area of $N_x$ by $N_y$, comprises dividing the area array of size $N_x$ by $N_y$ into slices of size New $N_x$ by New $N_y$, the direction of the slices and the number of slices being selected according to predetermined partitioning criteria.

15. A method for restructuring an image into a data model according to claim 14 wherein the direction of the slices is determined by a partitioning criterion equal to Desired Minimum Number of Children in One Direction at Leaf Level, the slicing being performed in a direction such that $N_x$ or $N_y$ will not be sliced if below the Desired Minimum Number of Children in One Direction at Leaf Level.

16. A method for restructuring an image into a data model according to claim 15 wherein the number of slices is determined by a partitioning criterion equal to Desired Number of Children at Higher Levels Max and the number of slices is equal to 2 to maximum of the Desired Number of Children at Higher Level.

17. A method for restructuring an image into a data model according to claim 13 further comprising the step of post-processing grouping to reduce the number of area specifications at higher levels of the model.

* * * * *